INVENTORS
HERBERT KROEMER
ROBERT D. FAIRMAN
BY John C Randa

INVENTORS
HERBERT KROEMER
ROBERT D. FAIRMAN
BY John C Randa

United States Patent Office 3,413,533

Patented Nov. 26, 1968

3,413,533

HETEROJUNCTION SEMICONDUCTOR DEVICES EMPLOYING CARRIER MULTIPLICATION IN A HIGH GAP RATIO EMITTER-BASE HETEROJUNCTION

Herbert Kroemer, Sunnyvale, and Robert D. Fairman, Newark, Calif., assignors to Varian Associates, Palo Alto, Calif., a corporation of California Filed Mar. 28, 1966, Ser. No. 538,071
10 Claims. (Cl. 317—235)

ABSTRACT OF THE DISCLOSURE

There is disclosed a three layer or element semiconductor junction transistor which exhibits the speed of a conventional triode semiconductor transistor and a current amplification factor $\alpha$ greater than unity. Current amplification occurs in the base region by virtue of energy and momentum exchange resulting when emitter injected carriers collide with like carriers in the base region. An emitter energy band gap at least twice as large as the base energy band gap and either a conduction or valence band gap edge discontinuity larger than the base energy band gap are necessary for n-p-n or p-n-p operation, respectively. Heavy base doping relative to the emitter in the range of 10–100 tends to reduce the energy notch at the emitter-base interface thus avoiding the trapping of minority carriers in the base region and insuring that the current amplification factor $\alpha$ will be greater than unity.

This invention is concerned with a novel type of transistor which utilizes the phenomena of electron multiplication at the emitter base junction. This electron multiplication occurs by employing a wide gap emitter and narrow gap base heterojunction chosen such that the conduction band edge discontinuity at the junction between the respective bottoms of the conduction bands of the emitter and base is larger than the forbidden energy band gap of the base. A detailed explanation is presented for the case of a ZnSe-Ge (n-p-n) configuration which illustrates the general principle and the conversion to the p-n-p case is obvious since it merely involves the substitution of appropriate subscripts or words ($e \leftrightarrow h$, $n \leftrightarrow p$, electron↔hole; conduction↔valence, etc.). The transistor of the present invention will find many uses in conventional amplifier, oscillator, etc. applications.

It is therefore an object of the present invention to provide a novel semiconductor device.

A feature of the present invention is the provision of a novel semiconductor device which involves majority carrier multiplication at a wide gap emitter to narrow base heterojunction.

Another feature of the present invention is the provision of a heterojunction transistor utilizing electron multiplication at the emitter to base heterojunction with an $\alpha$ greater than 1.

Another feature of the present invention is the provision of a transistor utilizing a ZnSe emitter and Ge base and collector regions.

Another feature of the present invention is the provision of a transistor utilizing a ZnS emitter and Si base and collector regions.

These and other features and advantages of the present invention will become more apparent upon a perusal of the following specification taken in conjunction with the accompanying drawings wherein.

1. THE BASIC CONCEPT

Figures 1, 2:
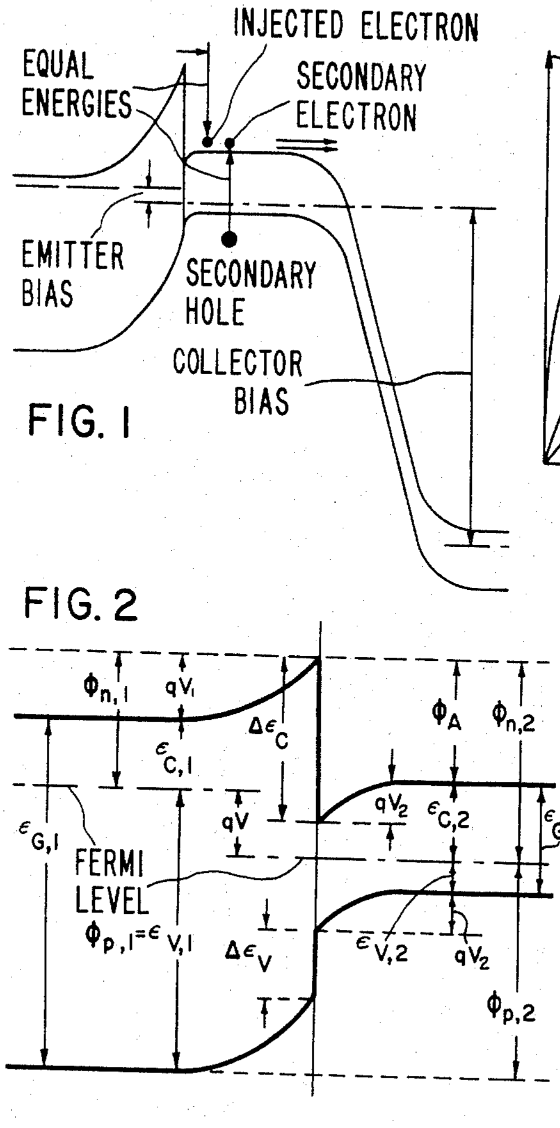
FIG. 1 shows an energy band diagram for an n-p-n transistor utilizing electron multiplication at a heterojunction emitter.
FIG. 2 is an illustrative graphical portrayal of the band structure of a multiplying emitter to base heterojunction.

The following discussion of the theoretical aspects of the novel transistor structure of the present invention which is capable of a current amplification factor, i.e., greater than unity, should aid the reader in obtaining a better understanding of same. It accomplishes this through the use of an emitter that consists of an abrupt heterojunction with a very large energy gap on the emitter side, so that the conduction band (we describe only the n-p-n case; the conversion to the p-n-p case is obvious) edge discontinuity at the junction interface is larger than the energy gap of the base semiconductor (FIG. 1).

The electrons injected by an n-type emitter of such a kind enter the base region as hot electrons, with an energy large enough that some of the electrons can produce internal secondaries, by lifting additional electrons from the valence band, as in an avalanche multiplication process. Actually, since both energy and momentum must be conserved in such a collision the threshold energy and the minimum conduction band discontinuity must be slightly larger than the energy gap in the base region. The magnitude of this additional energy can be estimated by theoretical reasoning, in any case, the conduction band discontinuity will also satisfy this somewhat more stringent criterion.

Because these secondary electrons are not contained in the emitter current but contribute to the collector current, the curent amplification factor $\alpha$ of such a transistor will be enhanced. Since for a good transistor $\alpha$ is close to unity to begin with, a relatively small fraction of internal secondary electrons is sufficient to raise $\alpha$ above unity, with all the drastic and well-known circuit implications of such a minor change.

There is no need for us to go into the circuit theory of such devices, for transistors with $\alpha > 1$ are, of course, nothing new. However, in all of the earlier structures the current multiplication took place somewhere on the collector side of the device, either by the utilization of avalanche multiplication in the collector junction, or by essentially combining two complementary transistors feeding each other, in a structure of four or more layers. Of the two possibilities, only the multilayer structures have survived. However, compared to high-speed semiconductor triodes these devices have remained severely speed limited. Their speed cannot exceed that of their internal carrier transit time feedback loop, and to equal the speed of a triode it would in essence be necessary to accommodate both an n- and a p-layer in the space normally occupied by the base region alone. This is technologically possible and makes economic sense only if the internal device dimensions can be fairly large to begin with, and so it is not surprising that these multi-layer devices make superb devices for comparatively low-speed line-power switching and control applications, but not at all for, say, microwave oscillators or other applications requiring similar speed capabilities.

The transistor structure discussed herein is of interest because, as a true triode, it would be potentially free of these limitations.

In transistors incorporating the teachings of the present invention the narrow-gap partner will be a good transistor material in its own right. This criterion would include Ge, Si and perhaps GaAs.

Since a good lattice fit is needed between the emitter and base semiconductors it can be stated rather safely that ZnSe on Ge and ZnS on Si are the two practical choices for the novel transistor emitter-base heterojunction.

Of these two combinations, ZnS-Si might ultimately be the more important one; however, ZnSe-Ge appears to be better suited to first demonstrate the principle. The technology of ZnSe is simpler than that of ZnS. The lattice misfit is less in the ZnSe-Ge system.

Unless otherwise stated, any numerical examples given hereinafter have therefore been chosen to correspond to the ZnSe-Ge case.

2. THE BAND STRUCTURE OF A MULTIPLYING EMITTER

2.1 *General*

We assume that the band structure of the heterojunction emitter is of the kind shown in FIG. 2, with subscript 1 referring to the emitter side and 2 to the base side. The magnitude of the individual band edge discontinuities $\Delta\epsilon_C$ and $\Delta\epsilon_V$ is not known, and must ultimately be determined experimentally. But based on the evidence of GaAs-Ge junctions, $\Delta\epsilon_C$ is likely to be the larger of the two. Of course, $$\Delta\epsilon_C+\Delta\epsilon_V=\Delta\epsilon_G=\epsilon_{G,1}-\epsilon_{G,2} \quad (2\text{–}1)$$

If the dopants on both sides are shallow donors and acceptors, there will be a depletion layer on both sides. If any space charge in interface states is negligible, the two depletion layers must contain the same amount of space charge. Further, if the "notch" on the narrow-gap side is not so deep as to approach the quasi-Fermi level on that side, the electron space charge in it can be neglected and one obtains $$N_1w_1=P_2w_2 \quad (2\text{–}2)$$

where N and P are the *net* donor and acceptor densities (assumed constant) and the *w*'s are the depletion layer widths. The corresponding voltages are given by $$V_1=\frac{q}{2\kappa_1\epsilon_0}N_1w_1^2 \quad (2\text{–}3a)$$

$$V_2=\frac{q}{2\kappa_2\epsilon_0}P_2w_2^2 \quad (2\text{–}3b)$$

and $$\frac{V_1}{V_2}=\frac{\kappa_2P_2}{\kappa_1N_1} \text{ or } \frac{V_1}{V_1+V_2}=\frac{\kappa_2P_2}{\kappa_1N_1+\kappa_2P_2} \quad (2\text{–}4a, b)$$

where $\epsilon_0$ is the vacuum permittivity and $\kappa_1$ and $\kappa_2$ are the dielectric constants. Finally, from FIG. 2, $$V_1+V_2=\frac{1}{q}[\Delta\epsilon_C-(\epsilon_{C,1}-\epsilon_{C,2})-qV] \quad (2\text{–}5)$$

From Eqs. 2–4*b* and 2–5, $$V_1=\frac{1}{q}\,\frac{\kappa_2P_2}{\kappa_1N_1+\kappa_2P_2}[\Delta\epsilon_C-(\epsilon_{C,1}-\epsilon_{C,2})-qV] \quad (2\text{–}6a)$$

$$V_2=\frac{1}{q}\,\frac{\kappa_1N_1}{\kappa_1N_1+\kappa_2P_2}[\Delta\epsilon_C-(\epsilon_{C,1}-\epsilon_{C,2})-qV] \quad (2\text{–}6b)$$

2.3 *The notch*

For a high gap ratio junction to show any electron multiplication, it is necessary that $$\Delta\epsilon_C>\epsilon_{G,2}+\delta\epsilon_0 \quad (2\text{–}7)$$

where $\delta\epsilon_0$ is the minimum excess energy an electron must have in order to be able to satisfy the law of conservation of momentum as well as that of energy. It can be shown that $\delta\epsilon_0$ is much smaller than $\epsilon_{G,2}$.

But, while Eq. 2–7 is a necessary condition for current multiplication, it is not a sufficient one, because of the conduction band notch on the base side of the heterojunction. While the secondary production itself might already occur if Eq. 2–7 is just satisfied, both the primary and the secondary electron would be trapped in the notch and would in all probability recombine before they have a chance to get thermally excited out of the notch. This would lead to a decreased rather than an increased injection current. Since the probability for thermal excitation is approximately proportional to the Boltzmann factor $$e^{-\frac{qV_2}{kT}}$$

it is obvious that a shallow notch is another essential requirement for a multiplying emitter.

It is important to recognize that this requirement exists even if the primary electron has enough energy so that both the primary and the secondary electron could escape from the notch without thermal excitation. This is because the electron transport through the base is basically a diffusion process, even if aided by a built-in drift field. Therefore, even initially untrapped electrons can get scattered back into the notch and get trapped there. The resulting consequences of this fact are as follows:

Since a junction with a deep notch is of no interest, there is no need to consider the complications and deviations from Eqs. 2–2 through 2–6 that occur when the bottom of the notch gets as close as or closer to the base Fermi level than the top of the valence band inside the base.

From Eq. 2–6*b* it then follows that current multiplication is favored by a low emitter-to-base doping ratio $N_1/P_2$, by way of example only $N_1P_2$ ratios of .1 to .01 are preferred, and by increased forward bias, because both reduce $V_2$. We will discuss the bias effects in the following section; in the present section we will discuss only the doping dependence.

Obviously, any multiplication of the electron current is of use only if most of the total junction current is electron injection rather than hole extraction current. Now the requirement of a low emitter-to-base doping ratio favors hole extraction, and a homojunction transistor built with such a ratio would be completely useless. But in the case of a ZnSe-Ge junction, the wide-gap emitter effect would be so strong as to completely compensate for this. A sufficient condition for a negligible hole extraction current would be $$\phi_{p,2}-\phi_{n,1}\gg kT \quad (2\text{–}8)$$

Actually, since the flow of electrons into "2" would be nearly unimpeded, while that of holes into "1" would be strongly diffusion limited, it is probably sufficient to require $$\phi_{p,2}>\phi_{n,1} \quad (2\text{–}9)$$

However, for our further considerations, we will use the more stringent requirement (2–8), in the form $$\phi_{p,2}-\phi_{n,1}-xkT>0 \quad (2\text{–}10)$$

$$x\gg1 \quad (2\text{–}10a)$$

This can be re-written $$\epsilon_{V,1}-(\epsilon_{C,2}+\phi_A)=\epsilon_{V,1}-\epsilon_{C,2}-\Delta\epsilon_C+qV_2-xkT>0 \quad (2\text{–}11)$$

Because of what we said earlier we want this condition to be satisfied even for vanishing notch depth, in which case it can be re-written, using Eq. 2–7:

$$\epsilon_{V,1}-\epsilon_{C,2}-xkT>\Delta\epsilon_C>\epsilon_{G,2}+\delta\epsilon_0(\epsilon_{V,1}-2\epsilon_{G,2})+(\epsilon_{V,2}-xkT)>\delta\epsilon_0 \quad (2\text{–}12)$$

If we now impose the additional and fairly obvious requirement that the base region is far from degenerately doped, that is $$\epsilon_{V,2}\geqq xkT \quad (2\text{–}13)$$

we obtain simply $$\epsilon_{V,1}-2\epsilon_{G,2}>\delta\epsilon_0 \quad (2\text{–}14)$$

as the condition for compatibility of electron multiplication with small hole extraction. Practical values for $\delta\epsilon_0$ are 10 to 20% of $\epsilon_{G,2}$. This condition is easily satisfied for ZnSe on Ge. With an energy gap ratio of about 4:1 the left side of Eq. 2–14 would be positive already for almost intrinsic ZnSe. Because of the wide energy gap of ZnSe such an emitter would be completely insulating, however, and for ZnSe with any reasonable conductivity at all the Fermi level will be above the middle of the ZnSe gap by an amount much larger than $\delta\epsilon_0$.

Before concluding this section, we might wish to point out that in all practical cases $$\delta\epsilon_0<\tfrac{1}{2}\epsilon_{G,2} \quad (2\text{–}15)$$

Eq. 2–14 will, therefore, always be satisfied if the more stringent requirement $$\epsilon_{V,1}>\tfrac{5}{2}\epsilon_{G,2} \quad (2\text{–}16)$$

is satisfied. This requirement, too, is easily satisfied for ZnSe-on-Ge.

3. PHENOMENOLOGICAL THEORY OF THE TRANSISTOR

Having shown that the hole extraction current can be made negligibly small we now present a simple phenomenological theory of the transistor with a multiplying emitter, under the following additional assumptions:

(a) The electrons of the emitter current are assumed to get multiplied by a constant factor $\eta$ upon crossing the heterojunction. Theoretical analysis can be used to show that the mean free path for secondary production is extremely short and we will treat this multiplication as taking place directly at the interface.

(b) The base is assumed so thin and of such a high electron lifetime that bulk recombination in the base is negligible. The only recombination mechanism considered is recombination at the heterojunction interface itself, which is assumed to be given by a recombination current $$j_r=qs_rn(o) \quad (3\text{–}1)$$

where $s$ is some recombination velocity analogous to a surface recombination velocity, and $n(o)$ is the electron density directly at the interface.

(c) We assume that the electron density $n(o)$ directly at the interface is in thermal equilibrium with the density $n_o$ just outside the notch, i.e.

$$n(o)=n_oe^{\frac{qV_2}{kT}} \quad (3\text{–}2)$$

leading to $$j_r=qs_rn_oe^{\frac{qV_2}{kT}} \quad (3\text{–}3)$$

Eq. 3–2 will be satisfied if the width of the notch is only a small fraction of the base width and the recombination current only a small fraction of the injected current. Both are requirements for a useful device in any case.

(d) High-level injection effects are neglected. The collector current density can then be written $$j_c=qs_cn_o \quad (3\text{–}4)$$

where $s_c$ is a "collection velocity" analogous to $s_r$. In a transistor without a built-in drift field, $$s_c=\frac{D_n}{w}=\mu_n\cdot\frac{kT}{qw} \quad (3\text{–}5a)$$

with a strong built-in drift field F $$s_c=\mu_nF \quad (3\text{–}5b)$$

We can now express the $\alpha$ of the transistor:

$$\alpha=j_c/\frac{1}{\eta}(j_c+j_r)=\frac{\eta}{1+\frac{s_r}{s_c}\exp\frac{qV_2}{kT}} \quad (3\text{–}6)$$

Figure 3:
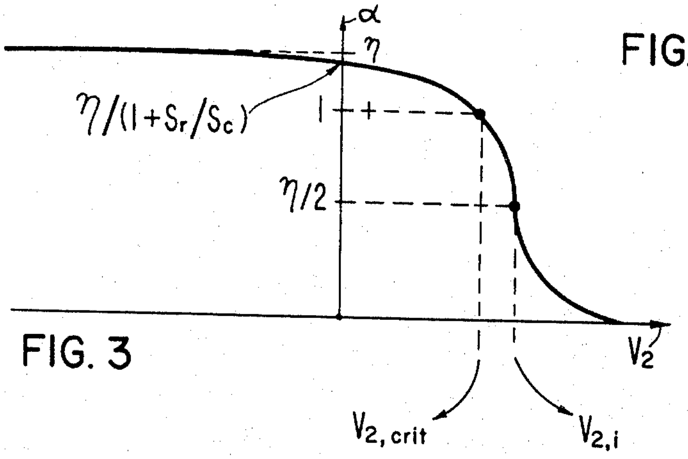
FIG. 3 is an illustrative graphical portrayal showing the dependence of transistor $\alpha$ on notch depth; $V_2$

The dependence of $\alpha$ on the notch depth $V_2$ is shown in FIG. 3, where $$V_{2,i}=\frac{kT}{q}\cdot ln\frac{s_r}{s_c} \quad (3\text{–}7)$$

is the notch depth at the inflection point of $\alpha$. This is a familiar-looking curve. The asymptotic value of $\alpha$, for a large negative $V_2$ is, of course, $\eta$. For just vanishing notch depth $$\alpha(0)=\frac{\eta}{1+s_r/s_c} \quad (3\text{–}8)$$

This is greater than unity if $$\eta-1>s_r/s_c \quad (3\text{–}9)$$

Since $\eta$ is going to be less than 2, we must have at least $$s_r<s_c \quad (3\text{–}10)$$

In general, the notch depth for which $\alpha=1$ is given by $$V_{2,\text{crit}}=\frac{kT}{q}\cdot ln\left[(\eta-1)\cdot\frac{s_r}{s_c}\right] \quad (3\text{–}11)$$

which is positive when Eq. 3–9 is satisfied. We will therefore make the assumption $V_{2,\text{crit}}>0$, which greatly simplifies the subsequent theory.

In this case $V_2$ can be expressed in terms of V, through Eq. 2–6*b*. This reverses the two sides of FIG. 3 but since the relationship between $V_2$ and V is a linear one it does not change the general shape of FIG. 3. Of greater practical importance is the expression of $\alpha$ as a function of the emitter current, rather than of $V_2$.

To this end we first express the notch depth $V_2$ in terms of the spike height, $V_1$, using Eq. 2–4*a*, i.e.

$$\alpha=\frac{\eta}{1+r\cdot\exp\gamma\frac{qV_1}{kT}} \quad (3\text{–}12)$$

where $$r=s_r/s_c \quad (3\text{–}13)$$

$$\gamma=\kappa_1N_1/\kappa_2P_2 \quad (3\text{–}14)$$

The current depends, of course, on the height of this barrier spike. If $V_{1,0}$ is this height for zero applied emitter voltage, the current will, in the first order, be given by an expression of the form $$I=I_o\left\{\exp\left[-\frac{q}{kT}(V_1-V_{1,0})\right]-1\right\}$$

where $I_o$ is the emitter reverse bias saturation current. Under actual operating conditions the emitter current will always be large compared to this current, and the "−1" term can be neglected. With this simplification $\alpha$ can be expressed as $$\alpha=\eta\frac{I^\gamma}{1^\gamma+rI_o^\gamma\exp\gamma\frac{qV_{1,0}}{kT}}=\eta\frac{I^\gamma}{1^\gamma+rI_o^\gamma\exp\frac{qV_{2,0}}{kT}} \quad (3\text{–}15)$$

where $V_{2,0}$ is the notch depth for zero emitter bias.

Figure 4:
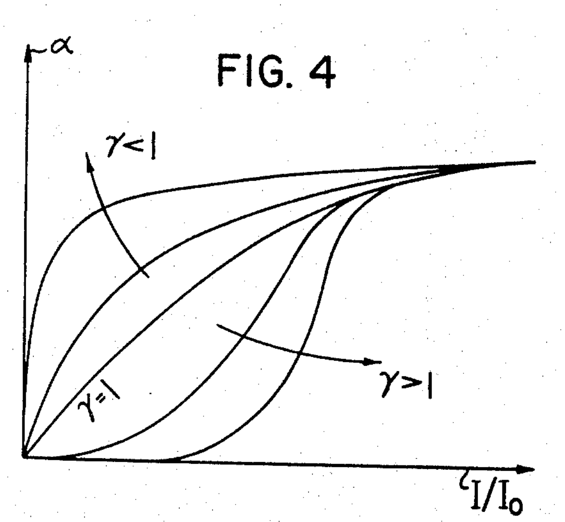
FIG. 4 is an illustrative graphical portrayal depicting the qualitative dependence of transistor $\alpha$ on $I/I_0$.

FIG. 4 shows the dependence of $\alpha$ on $I/I_0$ for various values of $\gamma$, for the same parameters $\eta$ and $r$ as in FIG. 3.

Figure 6:
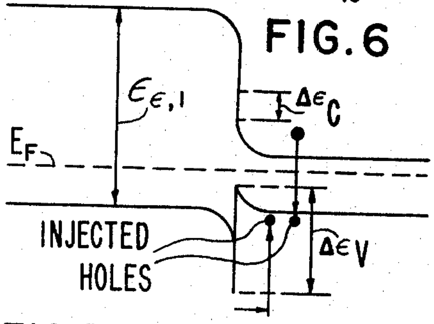
FIG. 6 is a simplified p-n multiplying emitter heterojunction which serves to illustrate the p-n-p case.
Figure 7:
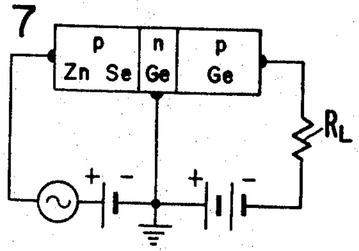
FIG. 7 is a schematic circuit diagram for a typical amplifier transistor circuit incorporating a p-n-p multiplying emitter configuration.
Figure 8A:
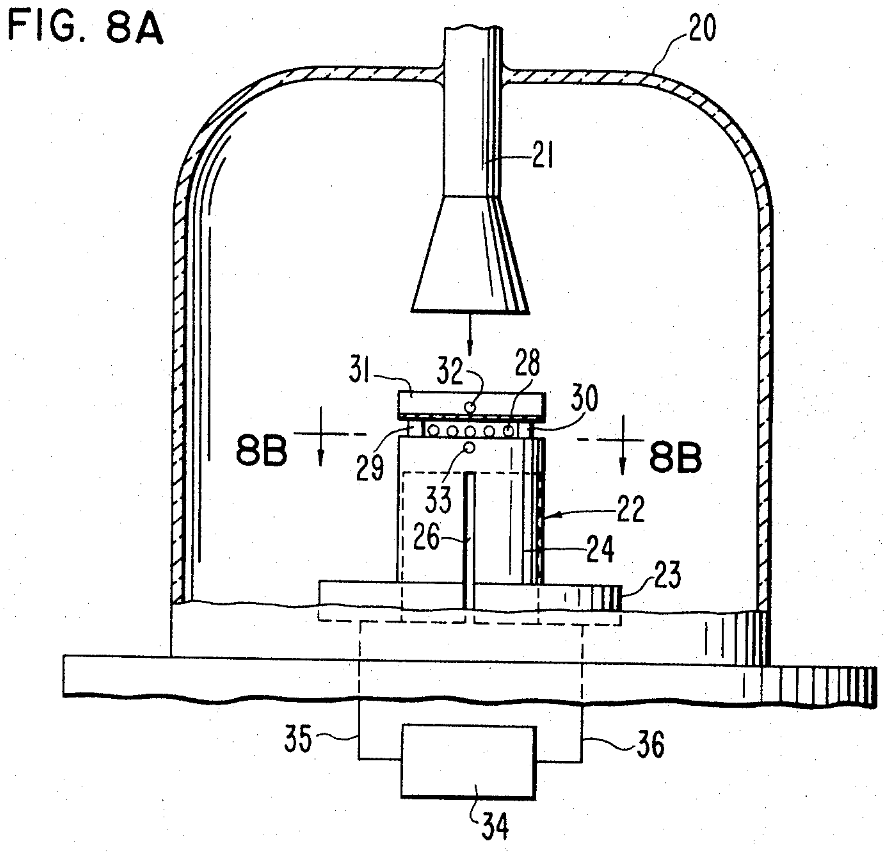
FIGS. 8A and 8B depict an epitaxial deposition chamber for preparing ZnSe-Ge heterojunctions.
Figure 8B:
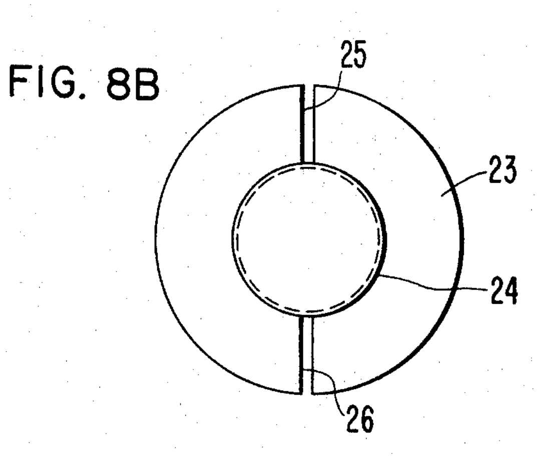

In FIG. 6 a simplified p-n multiplying emitter heterojunction is depicted for illustrative purposes. The important parameters are reversed with respect to the n-p case and $\Delta\epsilon_V$ must be larger than $\epsilon_{G,2}$ rather than $\Delta\epsilon_C$ as in the n-p case since the majority injected carriers are holes rather than electrons. A typical biasing circuit for p-n-p amplifier operation is shown in FIG. 7. Since transistor amplifier, oscillator etc. circuitry is extremely well developed there would appear to be no reason for further development of the uses for the novel multiplying emitter transistor of the present invention.

Figure 5:
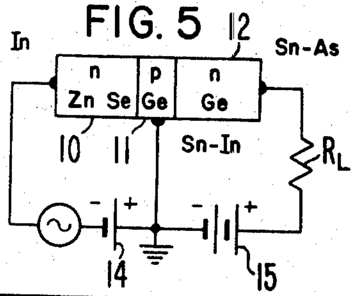
FIG. 5 is a schematic circuit diagram for a typical amplifier transistor circuit incorporating a n-p-n multiplying emitter configuration.

In FIG. 5 an illustrative n-p-n amplifier schematic circuit is depicted. The junction structure includes a n-ZnSe wide gap emitter 10 with $\Delta\epsilon_C$ larger than $\epsilon_{G,2}+\delta\epsilon_0$, with a low emitter to base doping ratio $N_1/P_2$ which provides $$\epsilon_{V,2} \geq xkT$$

with $$\epsilon_{V,1} - 2\epsilon_{G,2} > \delta\epsilon_0$$

which is easily satisfied for ZnSe on Ge. The base 11 is pGe and the collector 12, n-Ge. The ohmic contacts can be alloyed In, Sn-In and Sn-As as shown or any other suitable means. The signal to be amplified is introduced by a signal generator 13 and suitable batteries 14, 15 or other known biasing arrangements may be provided.

With regard to the preparation of the transistors of the present invention, the following discussion pertains thereto. The present state of the art technology with respect to p-n, n-p homojunctions like pGe-nGe, nGe-pGe and nSi-pSi, pSi-nSi is extremely well advanced and any one of several known methods may be utilized to prepare the base-collector regions of the transistor and reference to any standard reference work may be made. The technology for ZnS and ZnSe preparation is not as developed to date and the heterojunction technology of ZnSe on Ge and ZnS on Si is also not extremely well developed to date. Therefore in the interests of expediency a few preparation examples will be given. Obviously, any known methods may be used to prepare transistors using multiplying emitters and this invention is not to be restricted to the following examples.

The preparation of both Si and Ge n-p and p-n homojunctions suitable for preparing the base and collection regions of the novel transistor of the present invention is taught in "Epitaxial P type Germanium and Silicon Films by the $H_2$ Reduction of $GeBr_4$, $SiBr_4$ and $BBr_3$" by K. J. Miller and M. J. Crieco in Journal of the Electrochemical Soc. Vol. 110, No. 2, p. 1252–1256 (1964). Now to form a complete transistor of the Zns-Si-Si type the ZnS emitter can be grown on the completed Si base collector using the technique described in Journal of the Electrochemical Society, Vol. 107, pages 973–976 (1960) entitled "Formation of Phosphor Films by Evaporation." The technology used to prepare tunnel diodes may also be used to prepare the homojunction base-collector regions with doping levels changed, of course, from the degenerate level to the appropriate non-degenerate levels taught by the present invention.

As far as the preparation of a ZnSe-Ge emitter-base heterojunction is concerned, the following approach may be used to deposit the ZnSe emitter on the formed Ge base collector portion of the transistor.

A quartz bell jar 20 forms a standard deposition chamber which is provided with any suitable flow pipe 21 for introducing the gaseous products. A graphite pedestal 22 is disposed at the bottom portion and takes the form of a thick base portion 23 and a thin walled central region 24 having two diametral slots 25, 26 as shown and a thick top portion 27 which holds the ZnSe chunks 28. A pair of quartz spacer bars 29, 30 are disposed on the pedestal top as shown and the ZnSe chunks or particles spread over the top of the pedestal as shown. A Ge seed wafer is disposed on the spacers as shown and weighted down with a graphite disc 31 as shown. The graphite disc and top of the pedestal were provided with suitable thermocouple leads 32, 33 for measuring the source and seed temperatures, the source being the ZnSe chunks doped with aluminum and the seed the Ge wafer. The graphite is provided with heater voltage from any suitable source 34 coupled via leads 35, 36 to the opposite halves of the bottom portion of the pedestal 22. Any conventional mounting arrangements may be used for bell jar. In operation good ZnSe on Ge was obtained by using this close-spaced chemical vapor transport of ZnSe in an $H_2$—HCl atmosphere. The thick top and slotted intermediate portions of the pedestal were found to provide good uniform currents and power dissipation in the pedestal walls and a very uniform temperature across the top. The pedestal used in one set up had a 1-in. central diameter and the spacer bars 29, 30 were 1.25 mm. in height.

While not optimized, good epitaxial growth was obtained by introducing a .06% HCl and 99.04% $H_2$ mixture into the chamber via flow pipe 21 in conjunction with a source temperature of 700° C. and a seed temperature of 575° C. Before turning on the heat, the system was purged for 10 minutes with argon and for 15 minutes with hydrogen, both at a high but not measured flow rate. After turning on the heater, the hydrogen flow rate was reduced to 50 cc./min. The HCl was not added to the $H_2$ stream until after the temperature equilibrated.

Deposition times of a few hours obtaining deposition rates of the order of 1 micron/hr. were obtained. The layer surfaces showed crystallographic facets all of which were identically oriented which indicates good epitaxy (epitaxial growth). Suitable n dopant levels of the ZnSe are achieved by standard diffusion of Al in the presence of Zn vapor.

To produce a usable transistor the p-n Ge homojunction can be used as the seed wafer and the n-ZnSe is then epitaxially deposited thereon to form a complete transistor. The epitaxial deposition techniques for ZnSe and ZnS taught in U.S. Pats. 3,218,204 and 3,244,912 may also advantageously be used to prepare the novel transistor of the present invention.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. A semiconductor junction transistor including a first region formed of one type of semiconductor material of one type of conductivity, an adjacent and contiguous second region formed of another type of semiconductor material of opposite conductivity type forming a heterojunction with said first region, said second region being more heavily doped than said first region, a third region of semiconductive material adjacent to and contiguous with said second region and having the same type of conductivity as the first region, the forbidden band gap of said first semiconductor material forming said first region being at least twice as large as the forbidden band gap of said second semiconductor material forming said second region, for providing minority carriers injected from said first region into said second region with sufficient energy to produce secondary minority carriers in said second region.

2. The semiconductor junction transistor defined in claim 1 wherein said first region is ZnSe and said second and third regions are Ge and the doping ratio of said first region to said second region is less than .1.

3. The semiconductor junction transistor defined in claim 1 wherein said first region is ZnS and said second and third regions are Si and the doping ratio of said first region to said second region is less than .1.

4. A semiconductor junction transistor having a current amplification factor $\alpha$ greater than unity comprising: an emitter formed of one type of semiconductor material of one type of conductivity and a base adjacent and contiguous to said emitter formed of another type of semiconductor material of opposite conductivity, said base being more heavily doped than said emitter, for providing in operation a base current which is greater in magnitude than the emitter current.

5. A semiconductor junction transistor as defined in claim 4 wherein the base-to-emitter doping ratio is at least 10.

6. A semiconductor junction transistor as defined in claim 4 wherein said emitter is ZnSe and said base is Ge and the base-to-emitter doping ratio is at least 10.

7. A semiconductor junction transistor as defined in claim 4 wherein said emitter is ZnS and said base is Si and the base-to-emitter doping ratio is at least 10.

8. A semiconductor junction transistor exhibiting current multiplication in the base region comprising a heterojunction emitter-base combination and a homojunction base-collector combination, said emitter being formed of one type of semiconductor material of one type of conductivity, said base being formed of another type of semiconductor material of opposite conductivity, said collector being formed of the same type of semiconductor material as said base and having the same type of conductivity as said emitter, and wherein said base is more heavily doped than said emitter.

9. A semiconductor junction transistor as defined in claim 8 wherein said emitter is ZnSe, said base and collector are Ge, and said base-to-emitter doping ratio is at least 10.

10. A semiconductor junction transistor as defined in claim 8 wherein said emitter is ZnS, said base and collector are Si and said base-to-emitter doping ratio is at least 10.

References Cited

UNITED STATES PATENTS

| | | | |
|---|---|---|---|
| 3,249,473 | 4/1966 | Holonyak | 148—175 |
| 3,261,726 | 7/1966 | Ruehrwein | 148—33.4 |

JOHN W. HUCKERT, *Primary Examiner.*

M. EDLOW, *Assistant Examiner.*